(12) United States Patent
Kunze et al.

(10) Patent No.: US 11,782,073 B2
(45) Date of Patent: Oct. 10, 2023

(54) PROBE EXTENSION SYSTEM, MEASUREMENT SYSTEM AND PROBE EXTENSION METHOD

(71) Applicant: ROHDE & SCHWARZ GMBH & CO. KG, Munich (DE)

(72) Inventors: Alexander Kunze, Munich (DE); Stefan Ketzer, Geiersthal (DE); Benedikt Lippert, Munich (DE); Martin Peschke, Vaterstetten (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 365 days.

(21) Appl. No.: 17/093,145

(22) Filed: Nov. 9, 2020

(65) Prior Publication Data
US 2022/0146551 A1 May 12, 2022

(51) Int. Cl.
*G01R 1/073* (2006.01)
*G01R 13/02* (2006.01)
(52) U.S. Cl.
CPC .............. *G01R 1/073* (2013.01); *G01R 13/02* (2013.01)

(58) Field of Classification Search
CPC ....... G01R 1/073; G01R 13/02; G01R 1/06788
USPC ........................................................ 324/76.39
See application file for complete search history.

(56) References Cited

U.S. PATENT DOCUMENTS

2020/0284822 A1\* 9/2020 Whittington ........... G01R 13/20

\* cited by examiner

*Primary Examiner* — Farhana A Hoque
(74) *Attorney, Agent, or Firm* — Brooks Kushman P.C.

(57) ABSTRACT

The present disclosure provides a probe extension system that allows extending the distance between a measurement device and a measurement probe. The probe extension system comprises a first releasable adaptor comprising a device-side electromechanical interface that is releasably couplable to a measurement interface of the measurement device, and a first cable-side electromechanical interface that is releasably couplable to an extension cable harness and that is in the first releasable adaptor electrically coupled to the device-side electromechanical interface, and a second releasable adaptor comprising a second cable-side electromechanical interface that is releasably couplable to the extension cable harness, and a probe-side electromechanical interface that is releasably couplable to the measurement probe and that is in the second releasable adaptor electrically coupled to the second cable-side electromechanical interface. Further, the present disclosure provides a respective measurement system and a probe extension method.

24 Claims, 8 Drawing Sheets

PROBE EXTENSION SYSTEM, MEASUREMENT SYSTEM AND PROBE EXTENSION METHOD

TECHNICAL FIELD

The disclosure relates generally to measurement and data acquisition systems and, more particularly, to measurement probes.

BACKGROUND

Oscilloscopes usually comprise at least one measuring input for connecting a measuring probe to the oscilloscope. Such measuring probes may comprise a measuring head that contacts the unit under test, a probe connector for connecting the probe to the oscilloscope and a probe cable of a predetermined length that couples the measuring head with the probe connector.

SUMMARY

The present disclosure will mainly be described in conjunction with oscilloscopes although the present disclosure is not limited to be used with oscilloscopes.

The present invention provides a probe extension system and a method for extending a probe. It is understood that independent claims of a claim category may be formed in analogy to the dependent claims of another claim category.

Accordingly, it is provided:

A probe extension system for extending the distance between a measurement device and a measurement probe, the probe extension system comprising a first releasable adaptor comprising a device-side electromechanical interface that is releasably couplable to a measurement interface of the measurement device, and a first cable-side electromechanical interface that is releasably couplable to an extension cable harness and that is in the first releasable adaptor electrically coupled to the device-side electromechanical interface, and a second releasable adaptor comprising a second cable-side electromechanical interface that is releasably couplable to the extension cable harness, and a probe-side electromechanical interface that is releasably couplable to the measurement probe and that is in the second releasable adaptor electrically coupled to the second cable-side electromechanical interface.

Modern measurement devices, like e.g., oscilloscopes, may be used to measure waveforms of electrical signals. To this end, a measurement device is usually coupled to the device or circuit under test via a measurement probe. The measurement probe is coupled to the measurement device via a probe connector e.g., a coaxial connector like a BNC connector, a probe cable couples the probe connector to the probe head that interfaces with the circuit under test to measure electrical signals in the circuit under test. The probe cable is of a specific length and may therefore not be easily extended.

There exist situations, where the limited length of a probe cable poses problems when executing measurements. This is for example the case if the device under test is very large compared to the length of the probe cable and multiple signals should be measured at the device under test and/or multiple devices under test are to be evaluated. In such cases it may be necessary to move the measurement device for every new measurement, which is time-consuming. Manually moving and reattaching the measurement device for a new measurement may in addition result in erroneous reattachment of the cabling, therefore requiring increased troubleshooting efforts.

The present disclosure acknowledges that fact that developing high quality measurement probes with high accuracy requires extensive measurements, testing and homologation during development of such a measurement probe. Providing a measurement probe with a new and longer probe cable would therefore require full re-evaluation and re-homologation and should therefore be avoided.

The present disclosure provides a probe extension system for extending the distance between a measurement probe and the respective measurement device and at the same time allows using a measurement probe with its original cable.

To this end, the probe extension system comprises the first releasable adaptor and the second releasable adaptor, which may be coupled to each other via a respective cable harness.

The first releasable adaptor comprises a device-side electromechanical interface that may be coupled to a measurement interface of the measurement device. The device-side electromechanical interface may therefore be mechanically coupled to the mechanical part of the measurement interface such that the first releasable adaptor is mechanically fixed to the measurement device. The mechanical interface may e.g. comprise a type of bayonet fitting or fastening, as it is present on BNC connectors, and/or dedicated mechanical fixing elements, like locking catches or the like. At the same time, the device-side electromechanical interface is electrically coupled to the electrical part of the measurement interface.

Internally in the first releasable adaptor the device-side electromechanical interface is electrically coupled to the first cable-side electromechanical interface. Electrical signals may therefore be exchanged or transmitted between the first cable-side electromechanical interface and the measurement interface of the measurement device via the device-side electromechanical interface. The first cable-side electromechanical interface may externally be coupled with a respective cable harness mechanically and electrically.

The probe extension system provides the second releasable adaptor as counterpart to the first releasable adaptor. While the first releasable adaptor is meant to be coupled to the measurement device, the second releasable adaptor is meant to be coupled to the measurement probe.

The second releasable adaptor therefore comprises a second cable-side electromechanical interface and a probe-side electromechanical interface. The probe-side electromechanical interface may be mechanically and electrically coupled to a measurement probe, especially to the probe interface of the measurement probe. The second cable-side electromechanical interface in contrast may be coupled to the same cable harness as the first cable-side electromechanical interface of the first releasable adaptor, but to the other end of said cable harness.

It is understood that the amount of additional length or the extension provided by the probe extension system depends on the length of the cable harness between the first releasable adaptor and the second releasable adaptor. Since the probe extension system may be provided without the cable harness, the cable harness may individually be chosen for every application in which the probe extension system is used.

With the above-mentioned features, the probe extension system allows easily extending the distance between the measurement device and the measurement probe, without the need to re-develop or re-evaluate existing measurement probes. Instead, existing probes may be used and the probe extension system may be provided between the measurement device and the measurement probe to provide the required distance. Instead of re-developing or re-evaluating a huge number of existing probes, only the components of the probe extension system need to be developed and homologated once.

It is understood, that although mostly explained with regard to oscilloscopes, the present disclosure is not limited to oscilloscopes and may also be applied to other measurement devices, like e.g. network analyzers, voltage meters, or the like.

Further embodiments of the present disclosure are subject of the further subclaims and of the following description, referring to the drawings.

In an embodiment, the device-side electromechanical interface and the first cable-side electromechanical interface each may comprise a data acquisition interface and a discrete interface, wherein the data acquisition interfaces may be internally connected to each other, and wherein the discrete interfaces may be internally connected to each other in the first releasable adaptor.

Measurement devices may comprise measurement interfaces for connecting measurement probes that provide two or more different types of electrical connection. For example, such a measurement interface may comprise a data acquisition interface and a discrete interface.

The data acquisition interface usually serves for acquiring waveform data, especially in oscilloscopes, and may be required to transmit signals with frequencies ranging from 0 Hz to multiple GHz.

In contrast, the discrete interface may serve to transmit additional control signals, provide a power supply e.g., for active probe components of a measurement probe, and perform additional signal transmissions.

The first releasable adaptor may be operated with such a measurement interface comprising two different types of interfaces and to this end provides the data acquisition interface and the discrete interface on the device-side electromechanical interface. When the first releasable adaptor is connected to the measurement interface of the measurement device, the data acquisition interface of the device-side electromechanical interface is electrically coupled to the data acquisition interface of the measurement device. In addition, when the first releasable adaptor is connected to the measurement interface of the measurement device, the discrete interface of the device-side electromechanical interface is coupled to the discrete interface of the measurement device.

Since the data acquisition interfaces and the discrete interfaces of the first releasable adaptor are internally connected or coupled to each other both, the data acquisition interface and the discrete interface of the measurement device, may be connected to the cable harness via the first cable-side electromechanical interface.

In a further embodiment, the data acquisition interfaces of the first releasable adaptor each may comprise a RF connector, especially a coaxial RF connector.

Usually, measurement probes comprise RF connectors to couple the respective probe to a measurement device. RF connectors are connectors that are designed to operate with signals in a frequency range of up to multiple GHz. RF connectors, like BNC connectors, usually are used with coaxial cables. Coaxial cables are designed to offer improved shielding over other types of cables. RF connectors are designed to maintain the shielding that the coaxial design offers and, therefore, do not allow external signals into the signal path through electromagnetic interference and capacitive pickup. RF connectors may also be designed to minimize the change in transmission line impedance at the connection in order to reduce signal reflection and power loss.

Especially, for the data acquisition interface RF connectors, like BNC connectors, may therefore be used to provide the ability to acquire signals with the measurement device in the GHz range, while extending the distance between the measurement device and the measurement probe with the probe extension system.

It is understood that the RF connectors are provided to the outside of the first releasable adaptor, i.e., from the device-side electromechanical interface towards the measurement device, and from the first cable-side electromechanical interface towards the cable harness.

In other embodiments, other connectors may be used that provide the required signal transmission quality and the required bandwidth for the respective application.

In another embodiment, the discrete interfaces of the first releasable adaptor each may comprise a multi-pin connector. In addition, the discrete interface of the first cable-side electromechanical interface may comprise a USB connector.

The applications that use the discrete interfaces are not as demanding regarding frequency range and signal quality as the applications that use the data acquisition interface. Consequently, simpler connectors and simpler cables may be used to extend the discrete interface.

A multi-pin connector, also called multi-contact connector here, may for example comprise a D-sub or D-subminiature connector, a USB connector or any other type of connector. Especially, on the measurement interface and the device-side electromechanical interface the multi-pin connector may also comprise a proprietary type of connector. Such a connector may e.g. comprise pins, contacts or contact pads on the measurement interface and corresponding spring contacts or contact springs on the device-side electromechanical interface, or vice versa. The number of pins or contacts may vary depending on the measurement device, and may e.g. range between 1 and 10, especially 2 and 8, 4 and 7, or may be 6. More contacts than 10 are also possible. It is understood, that in this context, the terms pin and contact are interchangeable and may refer to the same physical element.

The first releasable adaptor may comprise a case, where the contacts of the discrete interface are mechanically positioned such that when the device-side electromechanical interface is coupled to the measurement device, the contacts of the discrete interface of the device-side electromechanical interface are electrically coupled to the respective contacts on the measurement device.

If a USB connector is used on the first cable-side electromechanical interface simple USB cables may be used to couple to the discrete interface of the first cable-side electromechanical interface.

In a further embodiment, the discrete interfaces may each comprise a digital data interface, especially a serial data bus interface or a USB interface.

The discrete interface of the measurement device, and therefore also the discrete interfaces of the device-side electromechanical interface and the first cable-side electromechanical interface may comprise a fully operational digital data interface, especially serial data bus interface or a USB interface. Therefore, a digital data communication, especially a USB communication, may be performed via the discrete interface.

The probe extension system may therefore also be used with measurement devices and measurement probes that in addition to the data acquisition interface comprise a digital data interface, like e.g. a USB interface. Such a USB interface may especially with active probes be used to provide energy supply and control functions for the active probes.

In yet another embodiment, the data acquisition interfaces may comprise a first dedicated internal ground connection in the first releasable adaptor, and the discrete interfaces may comprise a second dedicated internal ground connection in the first releasable adaptor.

As explained above, the data acquisition interface is used for acquiring signals in the frequency range of up to multiple GHz. The signal paths for such signals should be isolated against external influences in order to achieve high quality signal measurements. However, a common ground of a high frequency signal path and a digital data signal path may provide negative interfering signals in the high frequency signal path.

The first releasable adaptor is consequently designed, to internally separate the signal lines as well as the grounding of the discrete interfaces and the data acquisition interfaces. To this end, a first dedicated ground connection is provided between the data acquisition interfaces in the first releasable adaptor, and a second dedicated ground connection is provided between the discrete interfaces in the first releasable adaptor. Negative interference in the ground of the data acquisition interface caused e.g., by noise in the ground connection of the discrete interfaces, is therefore effectively prevented.

In addition, in the housing of the first releasable adaptor a mechanical separation may also be provided between the signal and ground lines of the data acquisition interfaces and the signal and ground lines of the discrete interfaces. For example, dedicated PCBs or cabling may be used for each of the interfaces. In addition, or as alternative, dedicated chambers may be provided for the respective PCBs or signal lines in a housing of the first releasable adaptor.

In another embodiment, the second cable-side electromechanical interface and the probe-side electromechanical interface may each comprise a data acquisition interface and a discrete interface. In addition, the data acquisition interfaces may be internally connected to each other, and the discrete interfaces may be internally connected to each other in the second releasable adaptor.

The second releasable adaptor may mirror the interfaces of the first releasable adaptor. Therefore, the second releasable adaptor may also comprise the same interface towards the cable harness as the first releasable adaptor and may forward the respective interfaces to the measurement probe.

Since the data acquisition interfaces are internally connected or coupled to each other and the discrete interfaces of the second releasable adaptor are internally connected or coupled to each other, both, the data acquisition interface and the discrete interface of the second releasable adaptor may be connected to the cable harness via the second cable-side electromechanical interface. The measurement probe may be coupled to the probe-side electromechanical interface. With a respective cable harness between the first releasable adaptor and the second releasable adaptor a signal path is provided between the measurement probe and the measurement device.

Regarding the interfaces of the second releasable adaptor, all the information provided above regarding the interfaces of the first releasable adaptor applies mutatis mutandis.

In a further embodiment, the data acquisition interfaces of the second releasable adaptor may each comprise a RF connector, especially a coaxial RF connector.

As explained above, measurement probes usually comprise an RF connector, like a BNC connector, on one end of the probe cable. The RF connector therefore allows easily connecting a measurement probe to the probe-side electromechanical interface. At the same time, a respective RF cable like e.g., a standard coaxial cable with respective connectors, may be used in the cable harness to couple the data acquisition interface of the first cable-side electromechanical interface to the data acquisition interface of the second cable-side electromechanical interface.

In another embodiment, the discrete interfaces of the second releasable adaptor each may comprise a multi-pin connector. In an embodiment, the discrete interface of the second cable-side electromechanical interface of the second releasable adaptor may comprise a USB connector.

As explained above, the multi-pin connector may be any type of connector comprising multiple electrical pins or contacts. Especially, on the probe-side electromechanical interface the multi-pin connector may be embodied like the above-mentioned proprietary interface.

The multi-pin connector on the probe-side electromechanical interface may especially mimic the multi-pin connector on the measurement interface of the measurement device by providing the same mechanical and electrical arrangement towards the measurement probe at the interface section. In fact, this statement may apply to the probe-side electromechanical interface as a whole i.e., also to the data acquisition interface of the probe-side electromechanical interface.

It is understood that also the device-side electromechanical interface may mimic the device-side interface of the measurement probe by providing the same mechanical and electrical arrangement for the interface section.

The second cable-side electromechanical interface in contrast may comprise a standard USB connecter, especially the same USB connector as the first cable-side electromechanical interface. As alternative, the second cable-side electromechanical interface may comprise the complementary USB connector for the USB connector provided on the first cable-side electromechanical interface. "Complementary" in this regard refers to the connectors usually provided on standard USB cables. Examples of such complementary USB connectors on USB cables may include, but are not limited to a USB-A plug with a USB-B plug, a USB-A plug with a USB Micro-B plug, a USB-A plug with a USB Mini-B plug, a USB-A plug with a USB C plug, a USB Mini-B plug with a USB Micro-B plug, and the like.

Using complementary USB connectors allows using a standard USB cable to couple the first releasable adaptor with the second releasable adaptor easily.

In yet another embodiment, the discrete interfaces may comprise a USB interface.

If not only the USB connector hardware is used for connectors and cables, but also a USB interface is implemented with the hardware, it is possible to use standard USB components for digitally communicating data between the measurement device and the measurement probe. Further, a USB interface not only provides data communication capabilities but also allows providing electrical supply power to the second releasable adaptor and/or the measurement probe.

It is understood that the cable harness may comprise cables specific to the respective type of interface or connector. For example, a respective cable harness may comprise a coaxial cable comprising RF connectors on both ends for coupling to the data acquisition interface of the first cable-side electromechanical interface and to the data acquisition interface of the second cable-side electromechanical interface. Further, such a cable harness may comprise a standard USB cable with the appropriate connectors to couple to the discrete interface of the first cable-side electromechanical interface and to the discrete interface of the second cable-side electromechanical interface. In an embodiment, the cable may e.g. comprise a USB Micro-B plug on both ends and the cable-side electromechanical interfaces may comprise respective connectors.

In an embodiment, the data acquisition interfaces may comprise a first dedicated internal ground connection in the second releasable adaptor, and the discrete interfaces may comprise a second dedicated internal ground connection in the second releasable adaptor.

The above-presented explanations regarding the dedicated ground connections in the first releasable adaptor also apply to the ground connections of the second releasable adaptor.

The second releasable adaptor is consequently designed, to internally separate the signal lines as well as the grounding of the discrete interfaces and the data acquisition interfaces. To this end, the first dedicated ground connection is provided between the data acquisition interfaces in the second releasable adaptor, and a second dedicated ground connection is provided between the discrete interfaces in the second releasable adaptor. Negative interference in the ground of the data acquisition interface caused e.g., by noise in the ground connection of the discrete interfaces, is therefore effectively prevented also in the second releasable adaptor.

In addition, in the housing of the second releasable adaptor a mechanical separation may also be provided between the signal and ground lines of the data acquisition interfaces and the signal and ground lines of the discrete interfaces. For example, dedicated PCBs or cabling may be used for each of the interfaces. In addition, or as alternative, dedicated chambers may be provided for the respective PCBs or signal lines in the second releasable adaptor.

In a further embodiment, the probe extension system may comprise a switching matrix and at least two second releasable adaptors. The switching matrix may be coupled between the first releasable adaptor and the at least two second releasable adaptors and the switching matrix may controllably couple the first releasable adaptor electrically with one of the at least two second releasable adaptors.

The switching matrix is an element that allows controllably coupling a single first releasable adaptor to a plurality of second releasable adaptors and therefore measurement probes. This allows extending the distance between a measurement device and multiple measurement probes and consecutively performing measurements with the measurement probes after the switching matrix is set to couple a respective one of the measurement probes with the first releasable adaptor.

In another embodiment, the switching matrix may comprise a third cable-side electromechanical interface for coupling the switching matrix with the cable harness that couples to the first cable-side electromechanical interface of the first releasable adaptor.

It is understood, that the third cable-side electromechanical interface may be provided in analogy to the second cable-side electromechanical interface and serves to couple to a cable harness that is on the other end coupled to the first cable-side electromechanical interface of the first releasable adaptor.

The information provided above regarding the second cable-side electromechanical interface therefore also applies to the third cable-side electromechanical interface.

Especially, the third cable-side electromechanical interface may also comprise a data acquisition interface and a discrete interface, as disclosed above for the second cable-side electromechanical interface.

In a further embodiment, the switching matrix may comprise a fourth cable-side electromechanical interface for each one of the at least two second releasable adaptors. Each one of the fourth cable-side electromechanical interfaces may couple the switching matrix to a cable harness that on the other end couples to the respective second releasable adaptor.

It is understood, that the fourth cable-side electromechanical interface may be provided in analogy to the first cable-side electromechanical interface and serves to couple to a cable harness that is on the other end coupled to a respective one of the at least two second releasable adaptors.

The information provided above regarding the first cable-side electromechanical interface therefore also applies to the fourth cable-side electromechanical interface.

Especially, the fourth cable-side electromechanical interface may also comprise a data acquisition interface and a discrete interface, as disclosed above for the first cable-side electromechanical interface.

In an embodiment, the switching matrix may comprise a switching circuit coupled between the third cable-side electromechanical interface and the fourth cable-side electromechanical interfaces. The switching circuit may comprise at least a switch for every one of the fourth cable-side electromechanical interfaces for controllably closing an electrical connection between the third cable-side electromechanical interface and the respective fourth cable-side electromechanical interface.

The switching circuit may comprise a switch for every fourth cable-side electromechanical interface that is capable of closing and opening an electrical connection for all electrical signal lines and ground lines, between the respective fourth cable-side electromechanical interface and the third cable-side electromechanical interface. The switches may be configured as mutually exclusive switches, meaning that only one switch may be closed at any point in time.

In another embodiment, the switching circuit may comprise switches only for the RF signal lines and RF ground lines, e.g. the data acquisition interface. The discrete interface may in such a case be provided as a single-master multi-slave digital bus system, like e.g., a serial bus or USB system. In such an embodiment, the switching circuit may comprise a respective signal distribution circuit with respective inputs and outputs. In a simple case, like e.g. a serial bus, the distribution circuit may be implemented as wire traces or signal lines coupling to a central communication point. In a USB system or the like, the distribution circuit may e.g. be provided as a respective HUB or Switch, e.g., as a USB hub. Selection of the active measurement probe may be performed by switches in the power lines of the USB interface that turn on or off power to the respective devices, or by respective data signals that select the active measurement probe via the USB interface.

In a further embodiment, the probe extension system may comprise a pulse source for generating a predetermined pulse signal. The pulse source may be coupled to the device-side electromechanical interface for transmitting the pulse signal into the device-side electromechanical interface. In addition, or as alternative, the pulse source may be coupled to the probe-side electromechanical interface for transmitting the pulse signal into the probe-side electromechanical interface.

It is understood that the pulse signal may be a pulse signal with known characteristics, e.g., with a predetermined pulse width, a predetermined pulse amplitude, a predetermined rise time and a predetermined fall or decay time. The pulse source may e.g. comprise a voltage source and a switch for activating the voltage source or closing a voltage output signal line of the voltage source. For adapting the characteristics like e.g., rise time and fall time, the pulse source may comprise analog circuitry, like e.g. capacitors, especially configurable capacitors or a switchable capacitor array for varying the capacitance in the voltage output signal line of the voltage source and therefore delaying the rise and fall of the voltage pulse.

The ability to inject a voltage pulse into the signal path between the device-side electromechanical interface and the probe-side electromechanical interface allows performing measurements, especially of a pulse response. After measuring the pulse response of the signal path, specific characteristics of the signal path may be determined, like e.g. a damping or damping factor of the signal path. The damping or damping factor may be used in the measurement device to perform respective signal amplification, e.g. via a respective amplifier circuit or processing-based with the digitalized signal data.

In case of an active measurement probe, the damping factor may also be provided e.g., to an amplifier in the measurement probe, and the amplifier may adapt the amplification factor or amplification level accordingly.

The correction of a signal depending on the characteristics of the signal path may also be called de-embedding. Especially, the measurement device may comprise a de-embedding circuit comprising e.g., amplifiers, attenuators, filters or the like, or a de-embedding function e.g., implemented as computer readable instructions that may be executed by a processor of the measurement device, or a combination of a de-embedding circuit and a respective de-embedding function.

The present disclosure also provides a measurement system comprising a measurement device comprising a number i.e., one or more, of measurement interfaces, a number i.e., one or more, of measurement probes, and at least one probe extension system according to the present disclosure, wherein a first releasable adaptor of the probe extensions system is coupled to one of the measurement interfaces and a second releasable adaptor of the probe extension system is coupled to one of the measurement probes.

The measurement system may be comprised of a measurement device, especially of an oscilloscope, with a number of measurement probes i.e., one or more. At least one of the measurement probes is coupled to the measurement device via a probe extension system according to the present disclosure. It is understood that the term "a number" in the context of the present disclosure is to be understood as comprising one or more than one e.g., two, three or more, of the respectively referenced elements.

The measurement device may comprise multiple i.e., more than one, measurement interfaces. For at least one but possible for more than one or all of the measurement interfaces a probe extension system may be provided as required in the respective measurement application.

With the measurement system complex measurement jobs e.g., including various devices under test, especially in multiple different climate chambers, and long measurement periods, especially ranging over multiple days or weeks, may efficiently be performed.

In yet another embodiment, the probe extension system may comprise at least one switching matrix and at least two second releasable adaptors for each switching matrix. The measurement system may further comprise at least two measurement probes for each switching matrix, each measurement probe coupled to one of the second releasable adaptors. Each one of the switching matrixes may be coupled between the first releasable adaptor and at least two of the second releasable adaptors.

The switching matrix allows coupling multiple probes to a single measurement interface of the measurement device. For example, a measuring job may require measuring a single device under test with multiple measurement probes for measuring different signals concurrently. In such a case, multiple devices under test may be wired up with measurement probes. The measurement probes of the devices under test that measure the same signals of the respective devices under test may all be coupled to a common switching matrix, in each case. The measurements with the different devices under test may then be performed sequentially for the single devices under test by switching all switching matrixes to the respective measurement probes. However, there is no need to reconfigure the measurement device for the different measurements if the same signals are measured at different devices under test via the same switching matrix in each case.

In a further embodiment, the measurement device may comprise a pulse source for generating a predetermined pulse signal. The pulse source may be coupled to the measurement interfaces of the measurement device. In addition, or as alternative, the measurement device may comprise a pulse interface for coupling the pulse source to the probe-side electromechanical interface for transmitting the pulse signal into the probe-side electromechanical interface.

The pulse source may be the same type of pulse source as explained above for the probe extension system. Therefore, the information provided above for the pulse source also applies to the pulse source in the measurement device.

The present disclosure also provides a probe extension method for extending the distance between a measurement device and a measurement probe, the probe extension method comprising releasably coupling a first releasable adaptor via a device-side electromechanical interface to a measurement interface of the measurement device, releasably coupling the first releasable adaptor via first cable-side electromechanical interface to an extension cable harness, wherein the first cable-side electromechanical interface is in the first releasable adaptor electrically coupled to the device-side electromechanical interface, releasably coupling a second releasable adaptor via second cable-side electromechanical interface to the extension cable harness, and releasably coupling the second releasable adaptor via a probe-side electromechanical interface to the measurement probe, wherein the probe-side electromechanical interface is in the second releasable adaptor electrically coupled to the second cable-side electromechanical interface.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
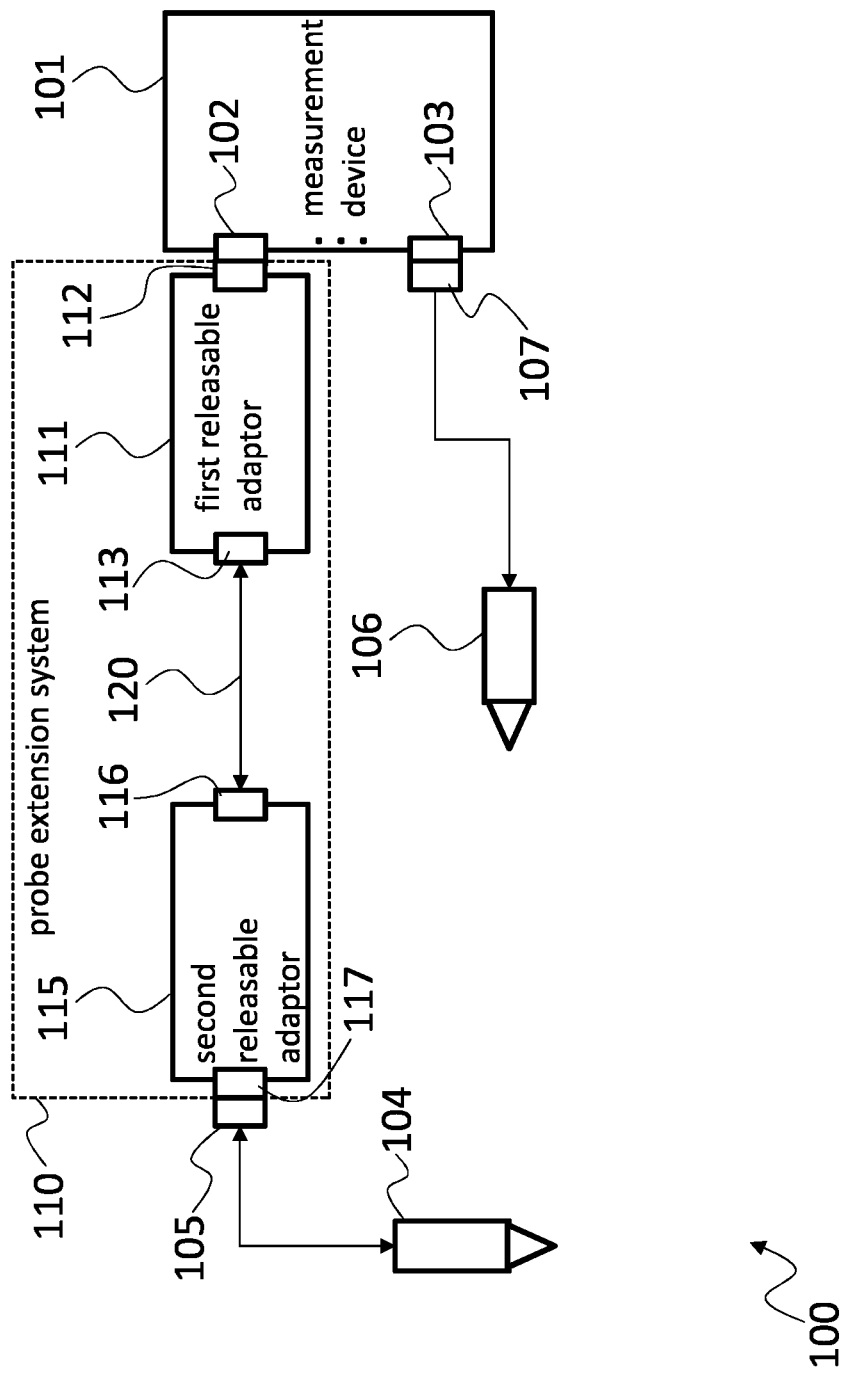
FIG. 1 shows a block diagram of an embodiment of a measurement system according to the present disclosure.

FIG. 1 shows a block diagram of a measurement system 100. The measurement system 100 comprises a measurement device 101 with a number of measurement interfaces 102, 103. The measurement system 100 further comprises two measurement probes 104, 106, and a probe extension system 110.

Two measurement interfaces 102, 103 are shown for the measurement device 101 and more possible measurement interfaces are hinted at by three dots. It is understood that a measurement device according to the present disclosure may comprise any number of measurement interfaces, starting with one measurement interface. Further, it is understood, that any number of probe extension systems may be present in measurement system 100, up to the number of measurement interfaces of the measurement device 101.

In order to exemplify the differences between using or not using the probe extension system 110, the measurement probe 106 is directly coupled via probe interface 107 to the measurement interface 103. In contrast, measurement probe 104 is indirectly coupled via the probe extension system 110 to the measurement interface 102.

The probe extension system 110 comprises a first releasable adaptor 111 and a second releasable adaptor 115. The first releasable adaptor 111 comprises a device-side electromechanical interface 112 that is directly coupled mechanically and electronically to measurement interface 102. The device-side electromechanical interface 112 may be identical to or at least may be compatible or interchangeable with the probe interface 105 mechanically and electrically.

Internally in the first releasable adaptor 111 the device-side electromechanical interface 112 is electrically coupled to a first cable-side electromechanical interface 113. A cable harness 120 is coupled on one end to the first cable-side electromechanical interface 113.

On the other end the cable harness 120 is coupled to a second releasable adaptor 115, especially to a second cable-side electromechanical interface 116 of the second releasable adaptor 115. Internally in the second releasable adaptor 115, the second cable-side electromechanical interface 116 is electrically coupled to a probe-side electromechanical interface 117.

It is understood that the internal coupling in the first releasable adaptor 111 and the second releasable adaptor 115 may be a wired coupling between the respective connectors. A circuit board-based coupling is also possible, where the connectors are soldered on a circuit board comprising the respective electronic traces for coupling the interfaces. A combination of a circuit board which is coupled to the respective connectors via cables is also possible.

Figure 2:
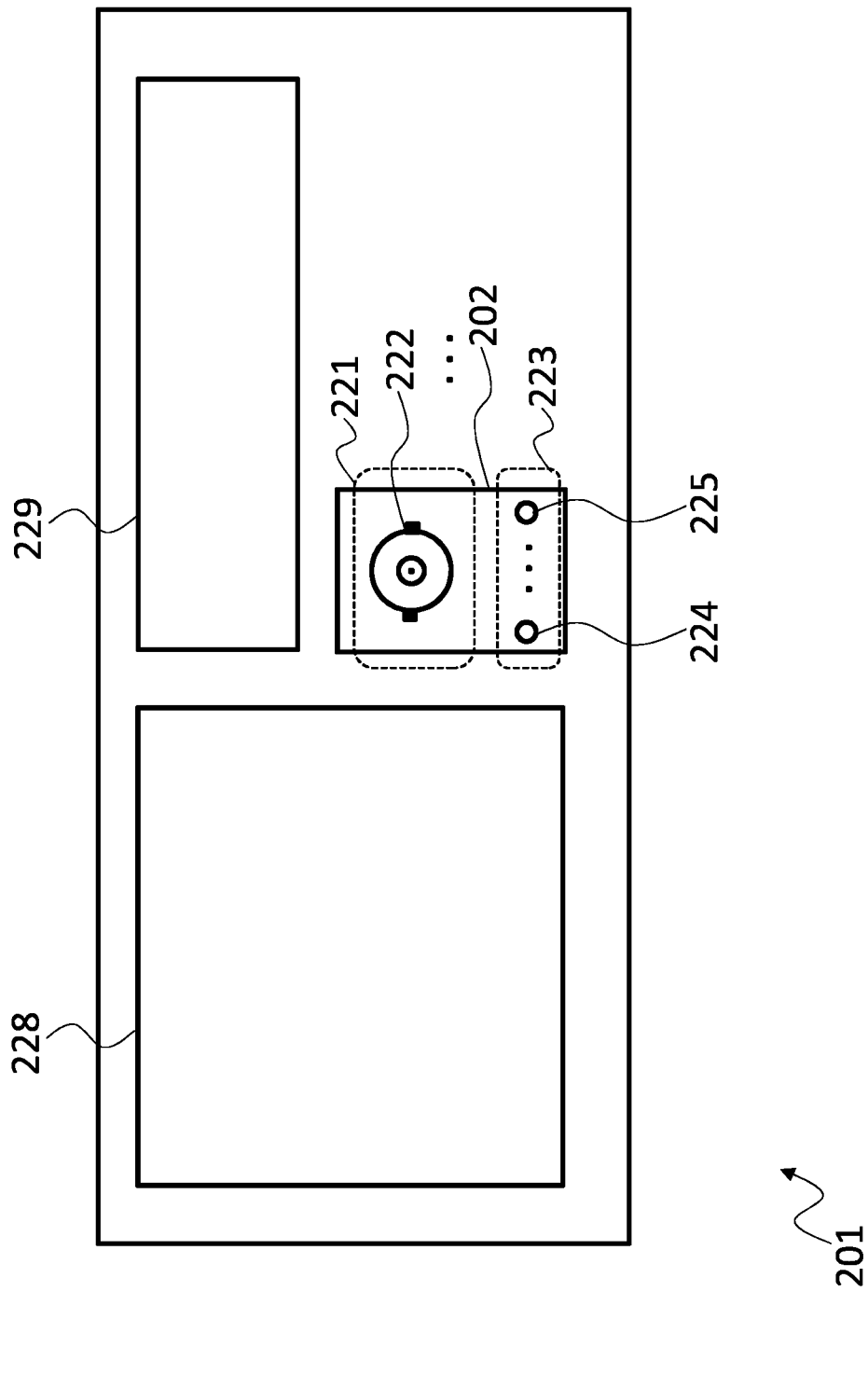
FIG. 2 shows a block diagram of an embodiment of a possible measurement device.

FIG. 2 shows a block diagram of a measurement device 201. The measurement device 201 is shown with a measurement interface 202. It is understood that the measurement device 201 may also comprise more than one measurement interface 202, as indicated by three dots. The measurement device 201 further comprises a display 228 and a user interface 229.

The measurement interface 202 comprises a data acquisition interface 221 with a BNC connector 222. In addition, the measurement interface 202 comprises a discrete interface 223. The discrete interface 223 comprises a number of contacts in the form of contact pads 224, 225. Only the first contact pad 224 and the last contact pad 225 are shown. The total number of contact pads may vary, and may range e.g., between 2 and 10 or more, or may be e.g., 2, 3, 4, 5, 6, 7, 8, 9 or 10 or more.

The BNC connector 222 is an exemplary connector that may be used in that data acquisition interface 221. As explained above, such connectors provide shielding to the signal path and reduce reflections on the signal path by providing a respective impedance. Further, BNC connectors provide a mechanical fixing for the cable by implementing a bayonet connector with a locking pin, that engages with the cable connector by rotation of the cable connector. This mechanism may also be used to fix the first releasable adaptor to the measurement device 201. It is understood that any other type of adequate RF connector may also be used. For example, RF connectors that do not require rotation or only rotation of a small angle e.g., of less than 90° or less than 180°, for coupling to a counterpart may be used. Other possible connectors may comprise dedicated fixing elements, like rotatable threaded rings or the like, that may be fixed without rotating the whole connector. Possible connectors include but are not limited to TNC connectors, UHF connectors, Type N connectors or SMA connectors.

The contact pads 224, 225 may be designed to engage with respective contacts on the first releasable adaptor. To this end, the contact pads 224, 225 may be provided as conductive pads that may engage with respective contacts of the first releasable adaptor, e.g. spring contacts or spring-loaded pins. As alternative, the contact pads 224, 225 may be provided as spring contacts or spring-loaded pins that engage with contact pads on the first releasable adaptor.

Although not explicitly shown, it is understood, that the measurement interface 202 may further comprise mechanical mounting and/or fixation elements, like e.g. locking catches or fasteners or other fastening elements. For example, snap-in recesses may be provided with the measurement interface 202, e.g. on the sides of the measurement interface 202 or the upper and lower edges of the measurement interface 202. Catches or fasteners of the first releasable adaptor may then engage with the recesses and mechanically fix the first releasable adaptor to the measurement device 201. With an additional mechanical fixation, it is not necessary to use the locking mechanism of a BNC connector. The first releasable adaptor may be fixed to the measurement device 201 i.e., to the measurement interface 202, by a simple linear or push movement.

Although not explicitly shown, it is understood, that the measurement device 201 may comprise a pulse source for generating a predetermined pulse signal. The pulse source may be coupled to measurement interface 202 for transmitting the pulse signal into the device-side electromechanical interface. In addition, or as alternative, the measurement device 201 may comprise a pulse interface to the measurement probe or a second releasable adaptor for transmitting the pulse signal into the probe-side electromechanical interface. As alternative, the pulse source may be provided as a dedicated device.

Figure 3:
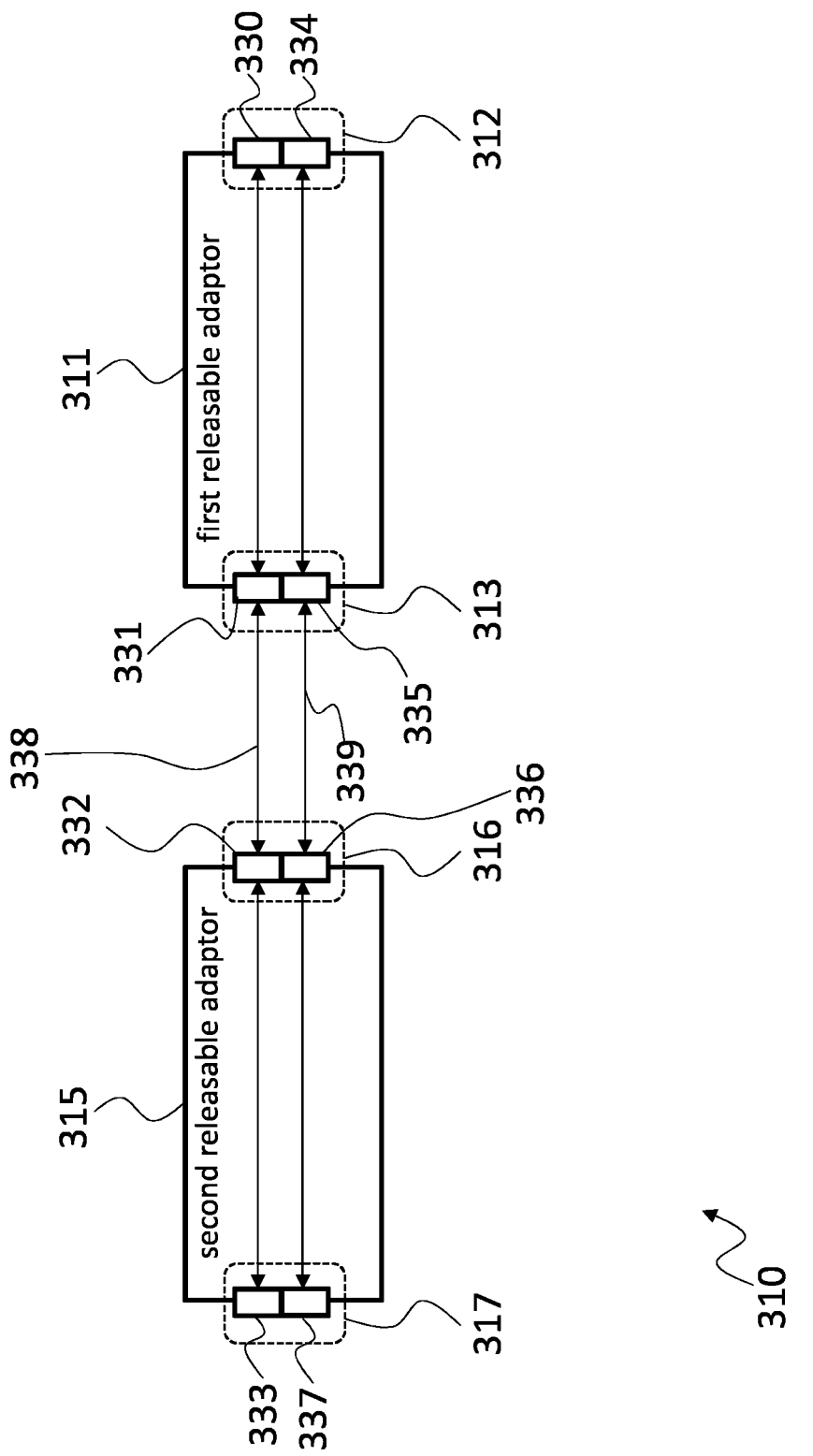
FIG. 3 shows a block diagram of an embodiment of a probe extension system according to the present disclosure.

FIG. 3 shows a block diagram of a probe extension system 310. The probe extension system 310 comprises a first releasable adaptor 311 that is coupled to a second releasable adaptor 315 via a coaxial cable 338 and a USB cable 339, which both form the cable harness that may be used with the probe extension system 310.

The first releasable adaptor 311 comprises a device-side electromechanical interface 312 and a first cable-side electromechanical interface 313. Both, the device-side electromechanical interface 312 and the first cable-side electromechanical interface 313 may be arranged on a housing of the first releasable adaptor 311, e.g. on opposing faces or sides of the housing or on adjacent sides or faces of the housing, that may e.g. comprise a 900 angle to each other.

The second releasable adaptor 315 comprises a second cable-side electromechanical interface 316 and a probe-side electromechanical interface 317. Both, the second cable-side electromechanical interface 316 and the probe-side electromechanical interface 317 may be arranged on a housing of the second releasable adaptor 315, e.g. on opposing faces or sides of the housing or on adjacent sides or faces of the housing, that may e.g. comprise a 90° angle to each other.

The probe extension system 310 serves for extending not only a data acquisition signal path but also a discrete signal interface. To this end, two signal paths are provided with the probe extension system 310.

A data acquisition signal path is formed by a data acquisition interface 330 on the device-side electromechanical interface 312, a data acquisition interface 331 on the first cable-side electromechanical interface 312, a data acquisition interface 332 on the second cable-side electromechanical interface 316, and a data acquisition interface 333 on the probe-side electromechanical interface 317.

A discrete signal path is formed by a discrete interface 334 on the device-side electromechanical interface 312, a discrete interface 335 on the first cable-side electromechanical interface 312, a discrete interface 336 on the second cable-side electromechanical interface 316, and a discrete interface 337 on the probe-side electromechanical interface 317.

As explained above, the cable harness may comprise a coaxial cable 338 and a USB cable 339. The coaxial cable 338 may couple the data acquisition interface 331 to the data acquisition interface 332. The USB cable 339 may couple the discrete interface 335 to the discrete interface 336. The possible extension range that may be provided by the probe extension system 310 depends on the length of the cable harness that is used with the probe extension system 310.

It is understood, that internally in the first releasable adaptor 311 the data acquisition interface 330 is electrically coupled to the data acquisition interface 331, and internally in the second releasable adaptor 315 the data acquisition interface 332 is electrically coupled to the data acquisition interface 333. The same applies to the discrete interfaces, wherein in the first releasable adaptor 311 the discrete interface 334 is internally coupled electrically to the discrete interface 335, and in the second releasable adaptor 315 the discrete interface 336 is electrically coupled to the discrete interface 337.

Figure 4:
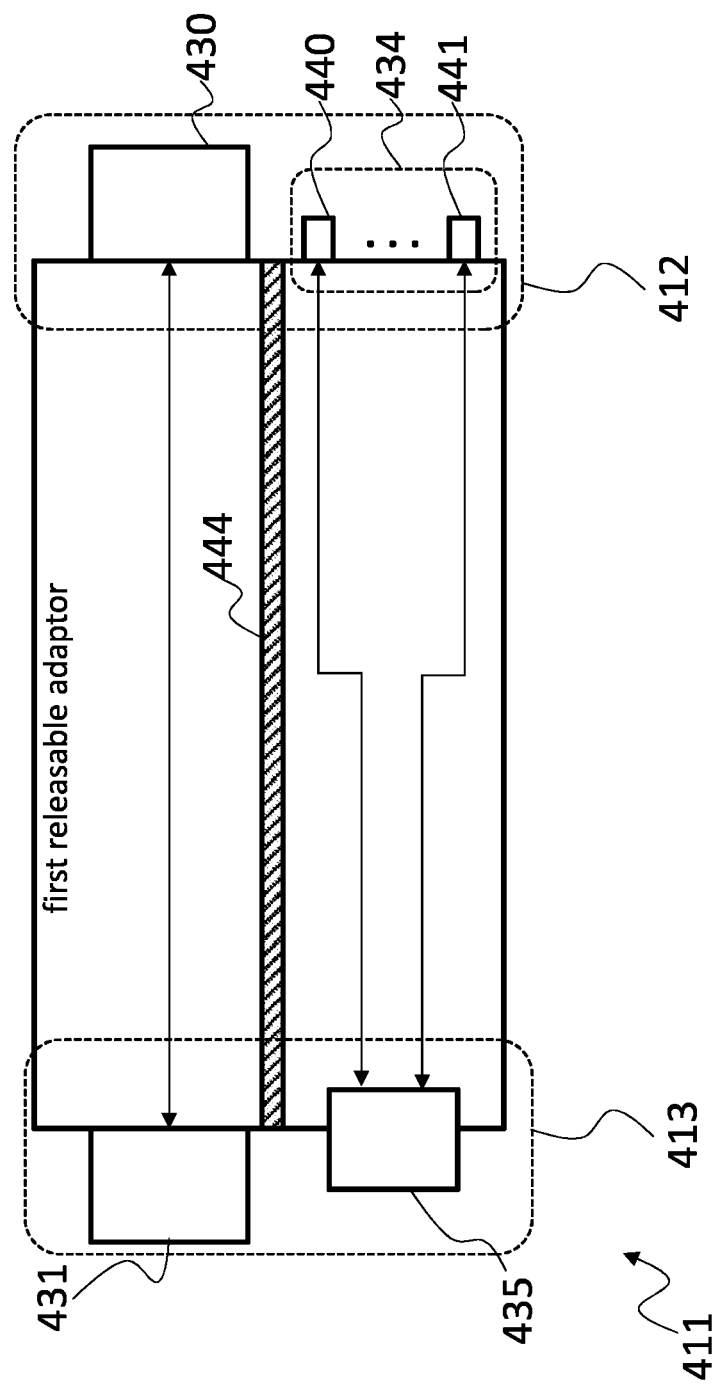
FIG. 4 shows a block diagram of an embodiment of a first releasable adaptor according to the present disclosure.

FIG. 4 shows a block diagram of a first releasable adaptor 411. The first releasable adaptor 411 comprises a device-side electromechanical interface 412 and a first cable-side electromechanical interface 413. Both, the device-side electromechanical interface 412 and the first cable-side electromechanical interface 413 are arranged on a housing of the first releasable adaptor 411 on opposing faces of the housing.

The device-side electromechanical interface 412 comprises a data acquisition interface 430 and a discrete interface 434. The data acquisition interface 430 comprises a RF connector that may be coupled directly to the respective counterpart of a measurement interface on a measurement device. The discrete interface 434 comprises spring contacts or spring-loaded contacts 440, 441 that may connect to contact pads of a measurement interface of a measurement device. The number of spring contacts or spring-loaded contacts 440, 441 may vary depending on configuration of the measurement interface and will provide one of the spring contacts or spring-loaded contacts 440, 441 for every contact pad of the measurement interface.

The first cable-side electromechanical interface 413 comprises a data acquisition interface 431 and a discrete interface 435. The data acquisition interface 431 comprises a RF connector for coupling to a coaxial cable. It is understood that the RF connector of the data acquisition interface 431 may be different from the RF connector of the data acquisition interface 430. For example, the RF connector of the data acquisition interface 430 may be provided without fastening elements if the first releasable adaptor 411 comprises separate fastening elements. In contrast, the data acquisition interface 431 may be provided with fastening elements, like e.g., in the case of a BNC connector, for fixing a cable to the data acquisition interface 431.

The discrete interface 435 comprises a USB connector that serves for coupling the discrete interface 435 to a USB cable. It is understood that the USB cable may be used for performing USB data transmissions or any other digital data transmission. For example, a RS-485 or CAN-Bus or other serial bus-based data transmission may also be performed via the lines of a USB cable. Using a USB connector and a USB cable allows using widely available cables that do not need to be manufactured specifically. It is, however, understood that other adequate connectors, like DB connectors and respective cables may also be used.

With the described configuration of the first cable-side electromechanical interface 413, the first releasable adaptor 411 may be used with standard BNC and USB cables.

In the first releasable adaptor 411 an optional separation wall 444 is shown. The separation wall 444 is placed inside of the housing of the first releasable adaptor 411 such that two chambers are created and the internal signal lines or traces may be routed in separate places. It is understood that the separation wall 444 may be provided of a conductive material or may be coated with such a material and may be grounded to improve the shielding effect.

Figure 5:
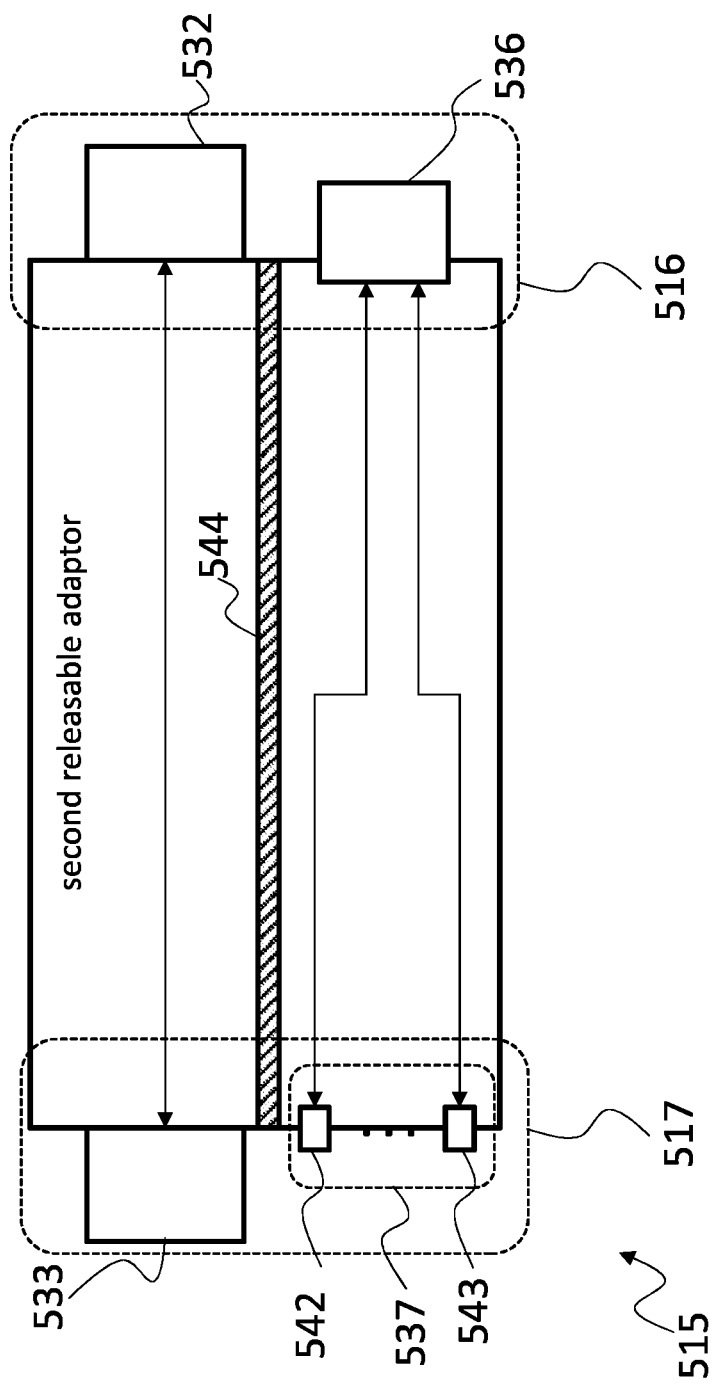
FIG. 5 shows a block diagram of an embodiment of a second releasable adaptor according to the present disclosure.

FIG. 5 shows a block diagram of a second releasable adaptor 515. The second releasable adaptor 515 comprises a second cable-side electromechanical interface 516 and probe-side electromechanical interface 517. Both, the second cable-side electromechanical interface 516 and the probe-side electromechanical interface 517 are arranged on a housing of the second releasable adaptor 515 on opposing faces of the housing.

The second cable-side electromechanical interface 516 comprises a data acquisition interface 532 and a discrete interface 536. The data acquisition interface 532 comprises a RF connector, especially a BNC connector, that may be coupled directly to the respective connector on a coaxial cable. The discrete interface 536 comprises a USB connector that serves for coupling the discrete interface 536 to a USB cable.

The probe-side electromechanical interface 517 comprises a data acquisition interface 533 and a discrete interface 537. The data acquisition interface 533 comprises a RF connector that may be coupled to a probe interface on a measurement probe. The discrete interface 537 comprises contacts 542, 543 that may connect to spring contacts or spring-loaded contacts of a probe interface of a measurement probe. The number of contacts 542, 543 may vary depending on the configuration of the probe interface and will provide one of the contacts 542, 543 for every spring contact or spring-loaded contact of the probe interface. It is understood that the number of contacts 542, 543 may be equal to the number of spring contacts or spring-loaded contacts 440, 441 of the first releasable adaptor 411.

With the described configuration of the second cable-side electromechanical interface 516, the second releasable adaptor 515 may be used with standard BNC and USB cables.

In the second releasable adaptor 515 an optional separation wall 544 is shown. The separation wall 544 is placed inside of the housing of the second releasable adaptor 515 such that two chambers are created and the internal signal lines or traces may be routed in separate places. It is understood that the separation wall 544 may be provided of a conductive material or may be coated with such a material and may be grounded to improve the shielding effect.

Figure 6:
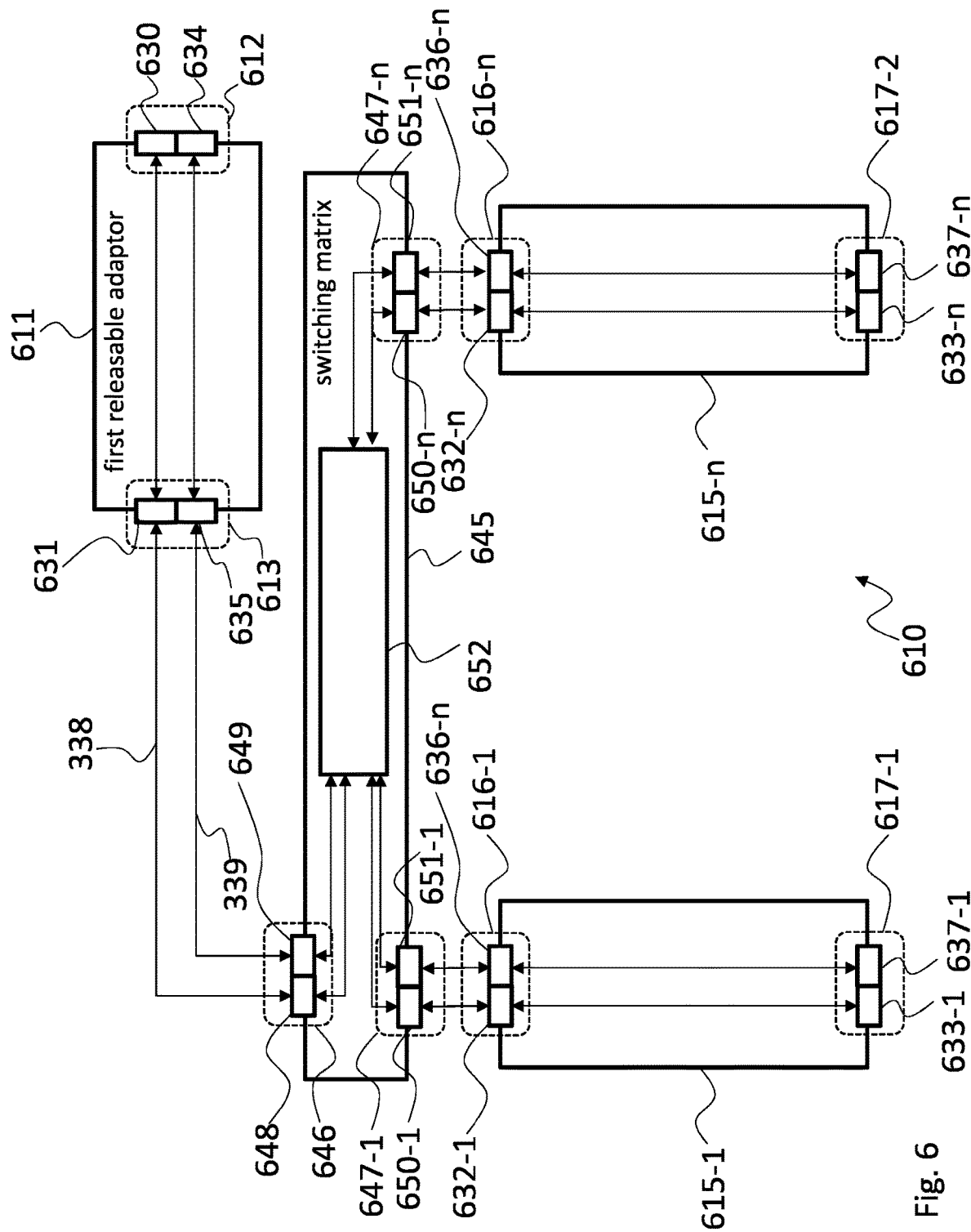
FIG. 6 shows a block diagram of another embodiment of a probe extension system according to the present disclosure.

FIG. 6 shows a block diagram of a probe extension system 610. The probe extension system 610 comprises a first releasable adaptor 611 that is coupled to multiple second releasable adaptors 615-1-615-n via a switching matrix 645. It is understood, that although only two second releasable adaptors 615-1-615-n are shown, any other number of second releasable adaptors is possible.

The first releasable adaptor 611 comprises a device-side electromechanical interface 612 with a data acquisition interface 630 and a discrete interface 634, and a first cable-side electromechanical interface 613 with a data acquisition interface 631 and a discrete interface 635. It is understood that the first releasable adaptor 611 may be a first releasable adaptor as described with regard to FIG. 4.

The second releasable adaptors 615-1-615-n are in the example of FIG. 6 configured equally, and each comprise a second cable-side electromechanical interface 616-1-616-n and probe-side electromechanical interface 617-1-617-n. The second cable-side electromechanical interfaces 616-1-616-n each comprise a data acquisition interface 632-1-632-n and a discrete interface 636-1-636-n. The probe-side electromechanical interfaces 617-1-617-n each comprises a data acquisition interface 633-1-633-n and a discrete interface 637-1-637-n. It is understood that the second releasable adaptors 615-1-615-n may be second releasable adaptors as described with regard to FIG. 5.

The switching matrix 645 comprises one third cable-side electromechanical interface 646, and a fourth cable-side electromechanical interface 647-1-647-n for every one of the second releasable adaptors 615-1-615-n. The third cable-side electromechanical interface 646 comprises a data acquisition interface 648 and a discrete interface 649.

Each one of the fourth cable-side electromechanical interfaces 647-1-647-n comprises a data acquisition interface 650-1-650-n and a discrete interface 651-1-651-n. It is understood, that the third cable-side electromechanical interface 646 may be provided like the second cable-side electromechanical interfaces 616-1-616-n of the second releasable adaptors 615-1-615-n, and that the fourth cable-side electromechanical interfaces 647-1-647-n may be provided like the first cable-side electromechanical interface 613 of the first releasable adaptor 611.

In the switching matrix 645 a switching circuit 652 is provided that is coupled to the third cable-side electromechanical interface 646 and to all fourth cable-side electromechanical interfaces 647-1-647-n. The switching circuit 652 allows controllably coupling the third cable-side electromechanical interface 646 to a single one of the fourth cable-side electromechanical interfaces 647-1-647-n, and therefore selecting the measurement probe that should be connected to the first releasable adaptor 611. To this end, the switching circuit may comprise respective connectors for connecting to the interfaces and a number of switches that perform the respective switching or coupling operations.

It is understood that the switching matrix 645 may be provided as a dedicated device or may be integrated e.g. in the first releasable adaptor 611 or may comprise the second releasable adaptors 615-1-615-n.

Figure 7:
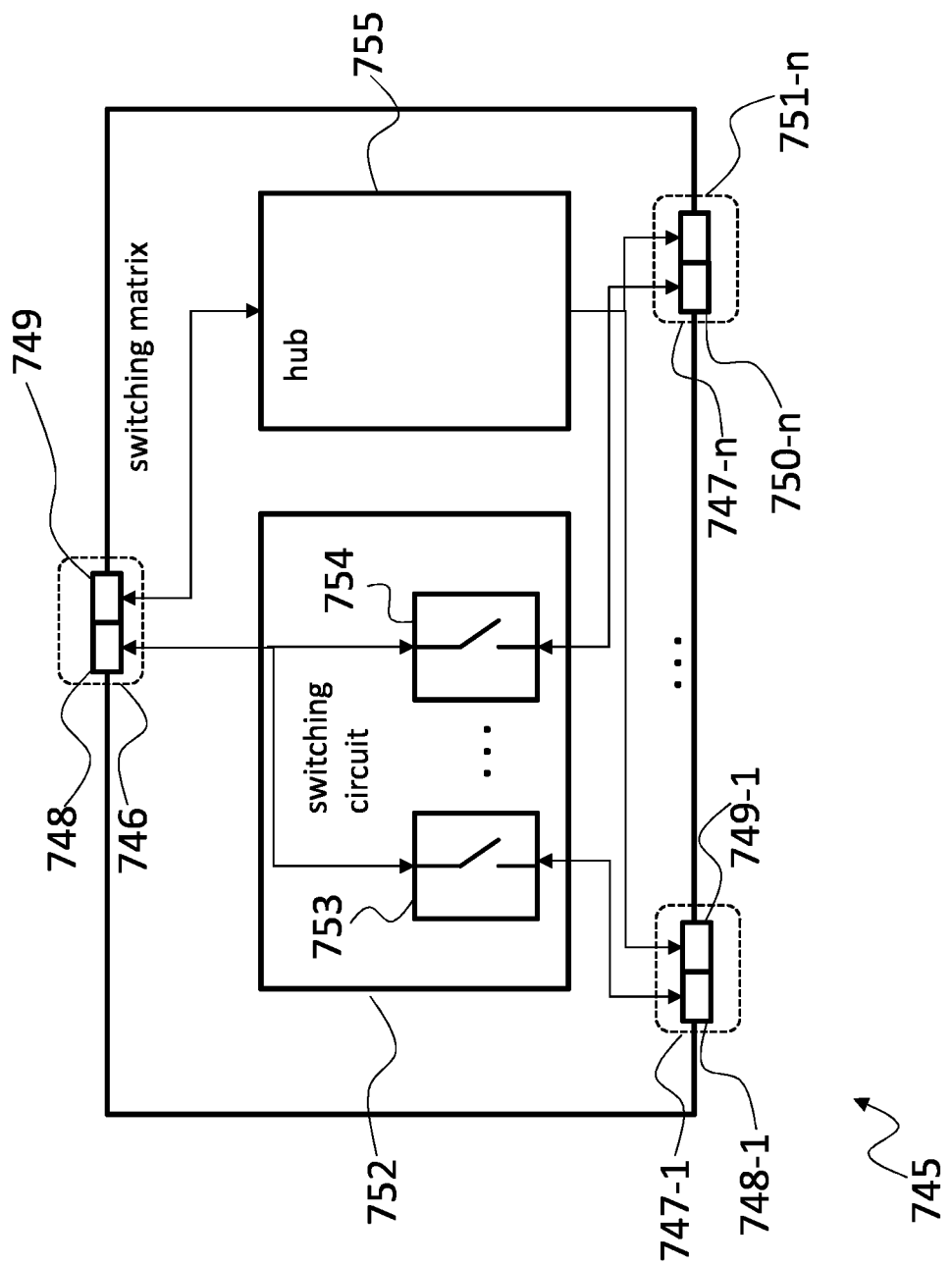
FIG. 7 shows a block diagram of an embodiment of a switching matrix according to the present disclosure.

FIG. 7 shows a block diagram of a switching matrix 745. Switching matrix 745 comprises a third cable-side electromechanical interface 746 and a number of fourth cable-side electromechanical interfaces 747-1-747-n, two of which are explicitly shown. It is understood that any number of fourth cable-side electromechanical interfaces is possible. The third cable-side electromechanical interface 746 serves for coupling the switching matrix 745 to a first releasable adaptor. The fourth cable-side electromechanical interfaces 747-1-747-n serve for coupling the switching matrix 745 to respective second releasable adaptors.

The third cable-side electromechanical interface 746 comprises a data acquisition interface 748 and a discrete interface 749. The fourth cable-side electromechanical interfaces 747-1-747-n each comprise a data acquisition interface 750-1-750-n and a discrete interface 751-1-751-n. It is understood that any of the above presented examples of cable-side electromechanical interfaces may be used in the switching matrix.

In the switching matrix 745 a switching circuit 752 is provided that serves for selectively coupling the data acquisition interface 748 with one of the data acquisition interfaces 750-1-750-n. The switching circuit 752 may be configured as mutually exclusive switching circuit 752, which in any moment in time couples only one of the data acquisition interfaces 750-1-750-n with the data acquisition interface 748.

The switching circuit 752 provides the switching capabilities with a plurality of switches 753, 754, wherein one switch is provided for every one of the data acquisition interfaces 750-1-750-nm. It is understood that the switches 753, 754 may e.g. be RF switches, like RF relays or semiconductor-based RF switches or the like. The switches on the side that is coupled to the third cable-side electromechanical interface 746 all couple to a single point or to the third cable-side electromechanical interface 746. On the side facing the data acquisition interfaces 750-1-750-*n*, each one of the switches 753, 754 couples to the respective one of the data acquisition interfaces 750-1-750-*n*. Therefore, if one of the switches 753, 754 is closed, an electrical connection between the receptive one of the data acquisition interfaces 750-1-750-*n* and the data acquisition interface 748 is established.

The switching matrix 745 further comprises a connection means for connecting the discrete interface 749 to the single discrete interfaces 751-1-751-*n*. In the shown embodiment, the connection means is provided as a USB hub 755 that is capable of connecting multiple discrete interfaces 751-1-751-*n* client-side and the discrete interface 749 host-side. Therefore, in the measurement device the discrete interface may be provided as USB interface and the measurement device may incorporate a USB host device. The measurement probes in contrast may each comprise a USB client device. It is understood, that in other embodiments other types of data transmission systems may be used with the discrete interface 749 and the discrete interfaces 751-1-751-*n*, like e.g., a serial bus system, e.g. a RS-485, CAN-Bus or the like.

During operation of the switching matrix 745, in the switching circuit 752 one of the switches 753, 754 will be closed at any time. The switching matrix 745 may comprise e.g., a user interface that allows a user to select, which one of the switches 753, 754 is to be closed.

As alternative, the discrete interface 749 may be used not only to provide additional signals to the measurement probes, but also to control the switches 753, 754. In such an embodiment, the switching matrix 745 may comprise a USB client device that allows the measurement device to provide control signals to the switching matrix 745, and especially to the switches 753, 754. The USB client device may e.g. be configured as a USB device that may be controlled by data control words that are transmitted via the USB interface and that provides switching outputs that are coupled to control inputs of switches 753, 754 to open or close the switches 753, 754. It is understood that a measurement device may allow a user to select the switches 753, 754 to be closed via its user interface. In addition, or as alternative, such a measurement device may allow a user to create a measurement program that comprises a switching sequence, and when running the measurement program automatically controls the switches 753, 754.

Since multiple USB devices may be connected to a USB host concurrently, in the presented embodiment, the discrete interfaces 751-1-751-*n* not necessarily need to be mutually exclusively connected to the discrete interface 749. Instead, all the discrete interfaces 751-1-751-*n* may be concurrently connected to the discrete interface 749. If for whatever reason it is required to mutually exclusively connect the discrete interfaces 751-1-751-*n* to the discrete interface 749, respective switches may be provided at least in the power lines between discrete interfaces 751-1-751-*n* and the USB hub 755. It is also possible to provide respective switches in all lines between discrete interfaces 751-1-751-*n* and USB hub 755.

With the switching matrix 745 it is therefore possible to easily operate multiple measurement probes on a single measurement interface of a measurement device with the probe extension system of the present disclosure.

For sake of clarity in the following description of the method-based FIG. 8 the reference signs used above in the description of apparatus-based FIGS. 1-7 will be maintained.

Figure 8:
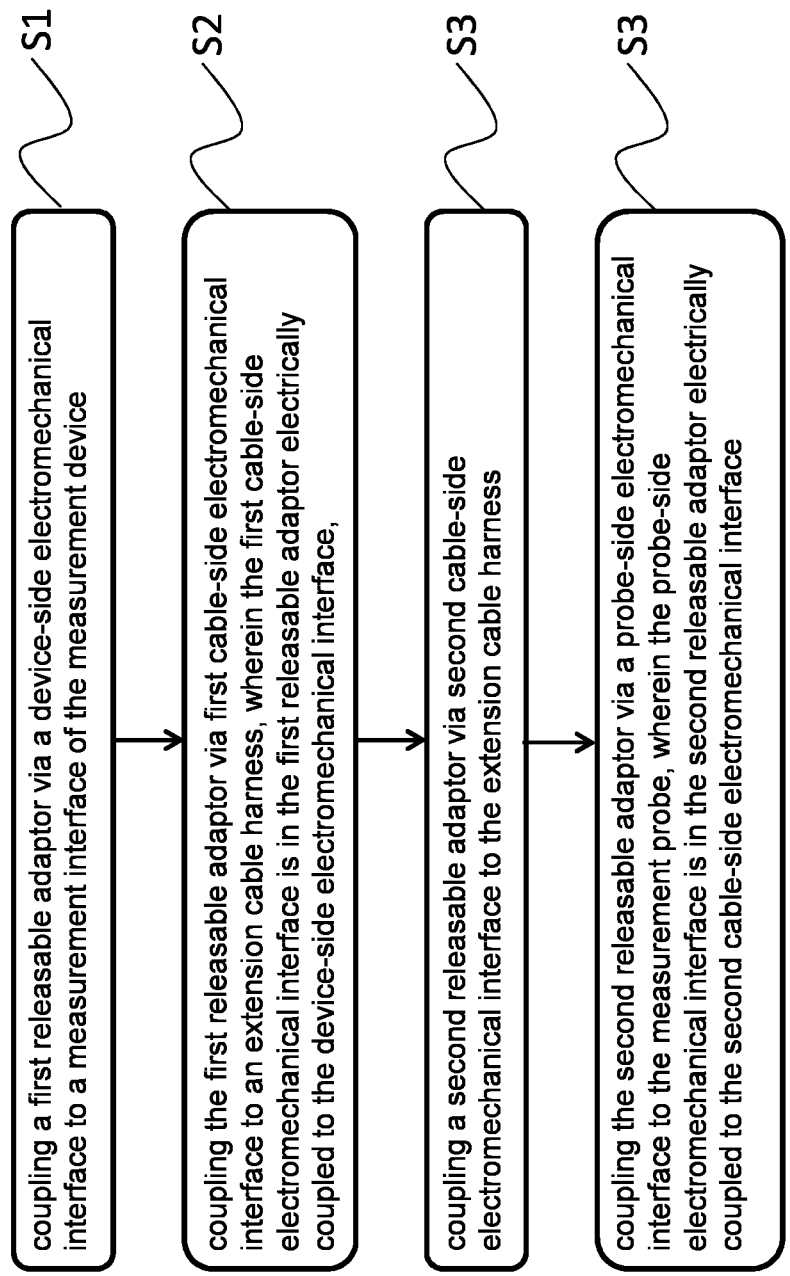
FIG. 8 shows a flow diagram of an embodiment of a probe extension method according to the present disclosure.

FIG. 8 shows a flow diagram of a probe extension method for extending the distance between a measurement device 101 and a measurement probe 104, 106.

The probe extension method comprises releasably coupling S1 a first releasable adaptor 111, 311, 411, 611 via a device-side electromechanical interface 112, 312, 412, 612 to a measurement interface 102, 103, 202 of the measurement device 101, releasably coupling S2 the first releasable adaptor 111, 311, 411, 611 via first cable-side electromechanical interface 113, 313, 413, 613 to an extension cable harness 120, wherein the first cable-side electromechanical interface 113, 313, 413, 613 is in the first releasable adaptor 111, 311, 411, 611 electrically coupled to the device-side electromechanical interface 112, 312, 412, 612, releasably coupling S3 a second releasable adaptor 115, 315, 515, 615-1, 615-*n* via second cable-side electromechanical interface 116, 316, 516, 616-1, 616-*n* to the extension cable harness 120, and releasably coupling S4 the second releasable adaptor 115, 315, 515, 615-1, 615-*n* via a probe-side electromechanical interface 117, 317, 517, 617-1, 617-*n* to the measurement probe 104, 106, wherein the probe-side electromechanical interface 117, 317, 517, 617-1, 617-*n* is in the second releasable adaptor 115, 315, 515, 615-1, 615-*n* electrically coupled to the second cable-side electromechanical interface 116, 316, 516, 616-1, 616-*n*.

The device-side electromechanical interface 112, 312, 412, 612 and the first cable-side electromechanical interface 113, 313, 413, 613 may each be provided with a data acquisition interface 221, 330,331, 332, 333, 430, 431, 532, 533, 630, 631, 632-1, 632-*n*, 633-1, 633-*n* and a discrete interface 223, 334, 335, 336, 337, 434, 435, 536, 537, 634, 635, 636-1, 636-*n*, 637-1, 637-*n*. The data acquisition interfaces 221, 330,331, 332, 333, 430, 431, 532, 533, 630, 631, 632-1, 632-*n*, 633-1, 633-*n* may be internally connected to each other, and the discrete interfaces 223, 334, 335, 336, 337, 434, 435, 536, 537, 634, 635, 636-1, 636-*n*, 637-1, 637-*n* may be internally connected to each other in the first releasable adaptor 111, 311, 411, 611. In addition, or as alternative, the second cable-side electromechanical interface 116, 316, 516, 616-1, 616-*n* and the probe-side electromechanical interface 117, 317, 517, 617-1, 617-*n* each may be provided with a data acquisition interface 221, 330,331, 332, 333, 430, 431, 532, 533, 630, 631, 632-1, 632-*n*, 633-1, 633-*n* and a discrete interface 223, 334, 335, 336, 337, 434, 435, 536, 537, 634, 635, 636-1, 636-*n*, 637-1, 637-*n*. The data acquisition interfaces 221, 330,331, 332, 333, 430, 431, 532, 533, 630, 631, 632-1, 632-*n*, 633-1, 633-*n* may be internally connected to each other, and the discrete interfaces 223, 334, 335, 336, 337, 434, 435, 536, 537, 634, 635, 636-1, 636-*n*, 637-1, 637-*n* may be internally connected to each other in the second releasable adaptor 115, 315, 515, 615-1, 615-*n*.

In addition, or as alternative, the data acquisition interfaces 221, 330,331, 332, 333, 430, 431, 532, 533, 630, 631, 632-1, 632-*n*, 633-1, 633-*n* of the first releasable adaptor 111, 311, 411, 611 each may be provided with a RF connector, especially a coaxial RF connector 222, and the discrete interfaces 223, 334, 335, 336, 337, 434, 435, 536, 537, 634, 635, 636-1, 636-*n*, 637-1, 637-*n* of the first releasable adaptor 111, 311, 411, 611 each may be provided with a multi-pin connector. The discrete interface 223, 334, 335, 336, 337, 434, 435, 536, 537, 634, 635, 636-1, 636-*n*, 637-1, 637-*n* of the first cable-side electromechanical interface 113, 313, 413, 613 may for example be provided with a USB connector, and a USB communication may be performed via the discrete interfaces 223, 334, 335, 336, 337, 434, 435, 536, 537, 634, 635, 636-1, 636-n, 637-1, 637-n.

The data acquisition interfaces 221, 330,331, 332, 333, 430, 431, 532, 533, 630, 631, 632-1, 632-n, 633-1, 633-n of the second releasable adaptor 115, 315, 515, 615-1, 615-n each may be provided with a RF connector, especially a coaxial RF connector, and the discrete interfaces 223, 334, 335, 336, 337, 434, 435, 536, 537, 634, 635, 636-1, 636-n, 637-1, 637-n of the second releasable adaptor 115, 315, 515, 615-1, 615-n each may be provided with a multi-pin connector. The discrete interface 223, 334, 335, 336, 337, 434, 435, 536, 537, 634, 635, 636-1, 636-n, 637-1, 637-n of the second cable-side electromechanical interface 116, 316, 516, 616-1, 616-n of the second releasable adaptor 115, 315, 515, 615-1, 615-n may for example be provided with a USB connector, and a USB communication may be performed via the discrete interfaces 223, 334, 335, 336, 337, 434, 435, 536, 537, 634, 635, 636-1, 636-n, 637-1, 637-n.

The probe extension method may also comprise controllably coupling a first releasable adaptor 111, 311, 411, 611 electrically with one of at least two second releasable adaptors 115, 315, 515, 615-1, 615-n via a switching matrix 645, 745 that is coupled between the first releasable adaptor 111, 311, 411, 611 and the at least two second releasable adaptors 115, 315, 515, 615-1, 615-n. In the switching matrix 645, 745 the switching may be performed with a switching circuit comprising respective switches 753, 752.

The probe extension method may further comprise generating a pulse signal with a pulse source, and transmitting the pulse signal into the device-side electromechanical interface 112, 312, 412, 612 and/or into the probe-side electromechanical interface 117, 317, 517, 617-1, 617-n. A a de-embedding of the signal path between the measurement probe 104, 106 and the measurement device 101 may be performed based on the measurements of the signal pulse in the measurement device 101.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS 100 measurement system
101, 201 measurement device
102, 103, 202 measurement interface
104, 106 measurement probe
105, 107 probe interface
110, 310, 610 probe extension system
111, 311, 411, 611 first releasable adaptor
112, 312, 412, 612 device-side electromechanical interface
113, 313, 413, 613 first cable-side electromechanical interface
115, 315, 515, 615-1, 615-n second releasable adaptor
116, 316, 516, 616-1, 616-n second cable-side electromechanical interface
117, 317, 517, 617-1, 617-n probe-side electromechanical interface
120 cable harness
221 data acquisition interface
222 BNC connector
223 discrete interface
224, 225 contact
228 display
229 user interface
330, 331, 332, 333, 430, 431, 532, 533 data acquisition interface
630, 631, 632-1, 632-n, 633-1, 633-n data acquisition interface
334, 335, 336, 337, 434, 435, 536, 537 discrete interface
634, 635, 636-1, 636-n, 637-1, 637-n discrete interface
338 coaxial cable
339 USB cable
440, 441 spring contact
542, 543 contacts
444, 544 separation wall
645, 745 switching matrix
646, 746 third cable-side electromechanical interface
647-1, 647-n, 747-1, 747-n fourth cable-side electromechanical interface
648, 650-1, 650-n, 748, 750-1, 750-n data acquisition interface
649, 651-1, 651-n, 749, 751-1, 751-n discrete interface
652, 752 switching circuit
753, 754 switch
755 hub
S1, S2, S3, S4 method step

What is claimed is:

1. A probe extension system for extending the distance between a measurement device and a measurement probe, the probe extension system comprising:
   a first releasable adaptor comprising a device-side electromechanical interface that is releasably and directly couplable mechanically and electronically to a measurement interface of the measurement device and that is arranged on a housing of the first releasable adaptor, and a first cable-side electromechanical interface that is releasably couplable to an extension cable harness and that is in the first releasable adaptor electrically coupled to the device-side electromechanical interface; and
   a second releasable adaptor comprising a second cable-side electromechanical interface that is releasably couplable to the extension cable harness, and a probe-side electromechanical interface that is releasably couplable to the measurement probe and that is in the second releasable adaptor electrically coupled to the second cable-side electromechanical interface.

2. The probe extension system according to claim 1, wherein the device-side electromechanical interface and the first cable-side electromechanical interface each comprise a data acquisition interface and a discrete interface, wherein the data acquisition interfaces are internally connected to each other, and wherein the discrete interfaces are internally connected to each other in the first releasable adaptor.

3. The probe extension system according to claim 2, wherein the data acquisition interfaces of the first releasable adaptor each comprise a RF connector.

4. The probe extension system according to claim 2, wherein the discrete interfaces of the first releasable adaptor each comprise a multi-pin connector.

5. The probe extension system according to claim 4, wherein the discrete interfaces each comprise a digital data interface.

6. The probe extension system according to claim 2, wherein the data acquisition interfaces comprise a first dedicated internal ground connection in the first releasable adaptor and the discrete interfaces comprise a second dedicated internal ground connection in the first releasable adaptor.

7. The probe extension system according to claim 1, wherein the second cable-side electromechanical interface and the probe-side electromechanical interface each comprise a data acquisition interface and a discrete interface, wherein the data acquisition interfaces are internally connected to each other, and wherein the discrete interfaces are internally connected to each other in the second releasable adaptor.

8. The probe extension system according to claim 7, wherein the data acquisition interfaces of the second releasable adaptor each comprise a RF connector, especially a coaxial RF connector.

9. The probe extension system according to claim 7, wherein the discrete interfaces of the second releasable adaptor each comprise a multi-pin connector, and especially wherein the discrete interface of the second cable-side electromechanical interface of the second releasable adaptor comprises a USB connector.

10. The probe extension system according to claim 9, wherein the discrete interfaces comprise a USB interface.

11. The probe extension system according to claim 7, wherein the data acquisition interfaces comprise a first dedicated internal ground connection in the second releasable adaptor and the discrete interfaces comprise a second dedicated internal ground connection in the second releasable adaptor.

12. The probe extension system according to claim 1, comprising a switching matrix and at least two second releasable adaptors, wherein the switching matrix is coupled between the first releasable adaptor and the at least two second releasable adaptors and wherein the switching matrix controllably couples the first releasable adaptor electrically with a selected one of the at least two second releasable adaptors.

13. The probe extension system according to claim 12, wherein the switching matrix comprises a third cable-side electromechanical interface for coupling the switching matrix with the cable harness that couples to the first cable-side electromechanical interface of the first releasable adaptor.

14. The probe extension system according to claim 12, wherein the switching matrix comprises a fourth cable-side electromechanical interface for each one of the at least two second releasable adaptors, wherein each one of the fourth cable-side electromechanical interfaces couples the switching matrix to a cable harness that on the other end couples to the respective second releasable adaptor.

15. The probe extension system according to claim 12, wherein the switching matrix comprises a third cable-side electromechanical interface for coupling the switching matrix with the cable harness that couples to the first cable-side electromechanical interface of the first releasable adaptor, the switching matrix comprises a fourth cable-side electromechanical interface for each one of the at least two second releasable adaptors, wherein each one of the fourth cable-side electromechanical interfaces couples the switching matrix to a cable harness that on the other end couples to the respective second releasable adaptor, and the switching matrix comprises a switching circuit coupled between the third cable-side electromechanical interface and the fourth cable-side electromechanical interfaces, and wherein the switching circuit comprising at least a switch for every one of the fourth cable-side electromechanical interfaces for controllably closing an electrical connection between the third cable-side electromechanical interface and the respective fourth cable-side electromechanical interface.

16. The probe extension system according to claim 1, comprising a pulse source for generating a predetermined pulse signal, wherein the pulse source is coupled to the device-side electromechanical interface for transmitting the pulse signal into the device-side electromechanical interface and/or wherein the pulse source is coupled to the probe-side electromechanical interface for transmitting the pulse signal into the probe-side electromechanical interface.

17. A measurement system comprising:
a measurement device comprising one or more measurement interfaces,
one or more measurement probes, and
at least one probe extension system according to claim 1, wherein a first releasable adaptor of the probe extensions system is coupled to one of the measurement interfaces and a second releasable adaptor of the probe extension system is coupled to one of the measurement probes.

18. The measurement system according to claim 17, wherein the probe extension system is a probe extension system according to claim 12 comprising at least one switching matrix and at least two second releasable adaptors for each switching matrix, and wherein the measurement system comprises at least two measurement probes for each switching matrix, each measurement probe coupled to one of the second releasable adaptors, and wherein each switching matrix is coupled between the first releasable adaptor and at least two of the second releasable adaptors.

19. The measurement system according to claim 17, wherein the measurement device comprises a pulse source for generating a predetermined pulse signal, wherein the pulse source is coupled to the measurement interfaces of the measurement device and/or wherein the measurement device comprises a pulse interface for coupling the pulse source to the probe-side electromechanical interface for transmitting the pulse signal into the probe-side electromechanical interface.

20. A probe extension method for extending the distance between a measurement device and a measurement probe, the probe extension method comprising:
releasably and directly coupling a first releasable adaptor via a device-side electromechanical interface to a measurement interface of the measurement device, the device-side electromechanical interface being arranged on a housing of the first releasable adaptor;

releasably coupling the first releasable adaptor via first cable-side electromechanical interface to an extension cable harness, wherein the first cable-side electromechanical interface is in the first releasable adaptor electrically coupled to the device-side electromechanical interface;

releasably coupling a second releasable adaptor via second cable-side electromechanical interface to the extension cable harness; and releasably coupling the second releasable adaptor via a probe-side electromechanical interface to the measurement probe, wherein the probe-side electromechanical interface is in the second releasable adaptor electrically coupled to the second cable-side electromechanical interface.

21. The probe extension method according to claim 20, wherein the device-side electromechanical interface and the first cable-side electromechanical interface each comprise a data acquisition interface and a discrete interface, wherein the data acquisition interfaces are internally connected to each other, and wherein the discrete interfaces are internally connected to each other in the first releasable adaptor; and wherein the second cable-side electromechanical interface and the probe-side electromechanical interface each comprise a data acquisition interface and a discrete interface, wherein the data acquisition interfaces are internally connected to each other, and wherein the discrete interfaces are internally connected to each other in the second releasable adaptor.

22. The probe extension method according to claim 21, wherein the data acquisition interfaces of the first releasable adaptor each comprise a RF connector, especially a coaxial RF connector, and wherein the discrete interfaces of the first releasable adaptor each comprise a multi-pin connector, especially wherein the discrete interface of the first cable-side electromechanical interface comprises a USB connector, wherein a USB communication is performed via the discrete interfaces; and wherein the data acquisition interfaces of the second releasable adaptor each comprise a RF connector, especially a coaxial RF connector, and wherein the discrete interfaces of the second releasable adaptor each comprise a multi-pin connector, especially wherein the discrete interface of the second cable-side electromechanical interface of the second releasable adaptor comprises a USB connector, wherein a USB communication is performed via the discrete interfaces.

23. The probe extension method according to claim 20, comprising controllably coupling a first releasable adaptor electrically with one of at least two second releasable adaptors via a switching matrix that is coupled between the first releasable adaptor and the at least two second releasable adaptors, especially wherein switching is performed with a switching circuit.

24. The probe extension method according to claim 20, comprising generating a pulse signal with a pulse source, and transmitting the pulse signal into the device-side electromechanical interface and/or into the probe-side electromechanical interface, and performing a de-embedding of the signal path between the measurement probe and the measurement device based on the measurements of the signal pulse in the measurement device.

* * * * *